(12) United States Patent
Yau et al.

(10) Patent No.: US 6,418,162 B1
(45) Date of Patent: Jul. 9, 2002

(54) FREQUENCY SPECTRUM MEASUREMENT APPARATUS

(75) Inventors: Man-Kit Yau, Tigard; Nikhil M. Deshpande, Beaverton; Kyle L. Bernard, Tigard, all of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/160,888

(22) Filed: Sep. 25, 1998

(51) Int. Cl.[7] .......................... H04B 17/00; H04L 27/12
(52) U.S. Cl. .................... 375/224; 375/295; 375/307
(58) Field of Search .................... 375/215, 224, 375/295, 297, 303, 306, 307, 226, 227, 334; 329/302, 303; 331/1 R, 2; 332/100; 327/105

(56) References Cited

U.S. PATENT DOCUMENTS

| | | | |
|---|---|---|---|
| 4,495,586 A | | 1/1985 | Andrews |
| 4,607,215 A | * | 8/1986 | Takano et al. ............ 324/76.23 |
| 4,755,951 A | | 7/1988 | Hollister |
| 4,845,443 A | * | 7/1989 | Stankey ........................ 331/11 |
| 5,185,874 A | | 2/1993 | Trent et al. |
| 5,262,957 A | * | 11/1993 | Hearn ........................... 702/76 |
| 5,309,479 A | * | 5/1994 | Cheah ........................... 375/303 |
| 5,311,318 A | | 5/1994 | Dobrovolny |
| 5,939,887 A | * | 8/1999 | Schmidt et al. ............. 324/628 |
| 6,122,326 A | * | 9/2000 | Jackson et al. ............. 375/308 |

* cited by examiner

*Primary Examiner*—Young T. Tse
(74) *Attorney, Agent, or Firm*—William K. Bucher; Francis I. Gray

(57) ABSTRACT

A frequency spectrum measurement apparatus sweeps a desired frequency range using multiple scan lines. A controller provides a non-contiguous sequence of input values to a frequency synthesizer operating as a local oscillator for generating a non-contiguous frequency output signal over the desired frequency range with each value offsetting a current frequency output signal from a previous frequency output signal. A mixer receives an input signal and the variable frequency synthesizer signal for generating an intermediate frequency signal that is filtered through a bandpass filter. The power of the intermediate frequency signal output of the bandpass filter is measured and displayed. The frequency spectrum measurement apparatus is usable in measuring out of channel emissions of a terrestrial RF broadcast digital television signal.

7 Claims, 3 Drawing Sheets

FREQUENCY SPECTRUM MEASUREMENT APPARATUS

BACKGROUND OF THE INVENTION

The present invention relates generally to frequency spectrum measurement apparatus and more particularly to a non-contiguous sweeping frequency spectrum measurement apparatus.

In traditional frequency spectrum measurements, the input signal spectrum is measured by linearly sweeping or stepping through a desired frequency range, bandpass filtering the signal and measuring the signal power after the bandpass filter. The time it takes to sweep the entire frequency range is highly dependent on the bandwidth of the bandpass filter, the frequency span and the frequency step size. To ensure the accuracy of the spectrum measurement, the frequency step size cannot be greater than 3 dB of the bandpass filter bandwidth. The point index of a conventional sweep may be mathematically expressed as follows:

$$f_1 f_2 \ldots f_m\, f_{(m+1)} f_{(m+2)} \ldots f_{(m+m)} \ldots f_{(n*m+1)}\, f_{(n*m+2)} \ldots f_{(n*m+m)}$$

where $f_1 f_2 \ldots f_{(n*m+m)}$ are frequency steps. $f_1$ is the start frequency and $f_{(n*m+m)}$ is the stop frequency. FIG. 1 illustrates the conventional sweep with the start frequency at 10 KHz, the stop frequency at 120 KHz and the frequency step size of 10 KHz. The frequencies are swept linearly from the start frequency of 10 KHz to the stop frequency of 120 KHz and the signal power at each frequency point is measured. For a given frequency span, a narrow bandpass filter provides a better spectrum resolution but the number of frequency steps to sweep across the frequency span increases. The spectrum measurement can also be performed using a wide bandpass filter with larger frequency step sizes resulting in lower spectral resolution.

What is needed is a frequency spectrum measurement apparatus that improves the perceived spectrum update rate while maintaining a high spectrum resolution.

SUMMARY OF THE INVENTION

Accordingly, a frequency spectrum measurement apparatus includes a synthesizer that generates a variable frequency output signal over a frequency range. The variable frequency output signal is mixed with an input signal in a mixer to produce an intermediate frequency signal. A controller generates a non-contiguous sequence of input values to the synthesizer for generating over the frequency range a non-contiguous frequency output signal from the synthesizer with each value offsetting a current frequency output signal from a previous frequency output signal. Means are provided for measuring the power of the intermediate frequency signal.

The controller includes a number generator for producing the non-contiguous sequence of input values to the synthesizer for generating the non-contiguous frequency output signal from the synthesizer having multiple frequency scan lines. The number generator produces at least a first and a second series of non-contiguous input values to the synthesizer for generating at least the first and second frequency scan lines. The first series of non-contiguous values produce a frequency scan line having a start frequency and a series of stepped frequency values corresponding to the first series of non-contiguous input values. The second series of non-contiguous input values produce a frequency scan line having a start frequency offset from the start frequency of the first scan line and a series of stepped frequency values offset from the stepped frequency values of the first scan line and corresponding to the second series of non-contiguous input values.

The frequency spectrum measurement apparatus further includes a bandpass filter that receives the intermediate frequency signal and generates a filtered intermediate frequency signal output that is amplified and coupled to an analog-to-digital converter. The analog-to-digital converter generates signal samples representative of the bandpass filtered intermediate frequency signal and the controller processes the signal samples for generating signal power values representative of the intermediate frequency signal. The average power of the input signal over the frequency range is displayed on a display device.

The objects, advantages and novel features of the present invention are apparent from the following detailed description when read in conjunction with the appended claims and attached drawings.

DETAILED DESCRIPTION OF THE PREFERRED EMBODIMENT

Figure 1:
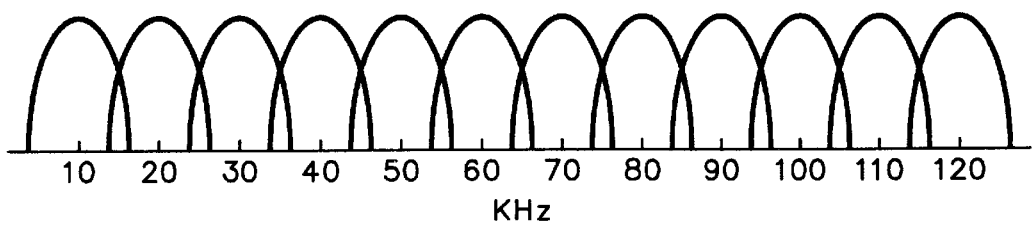
FIG. 1 is a visual representation of a conventional prior art linearly swept frequency spectrum measurement apparatus.
Figure 2:
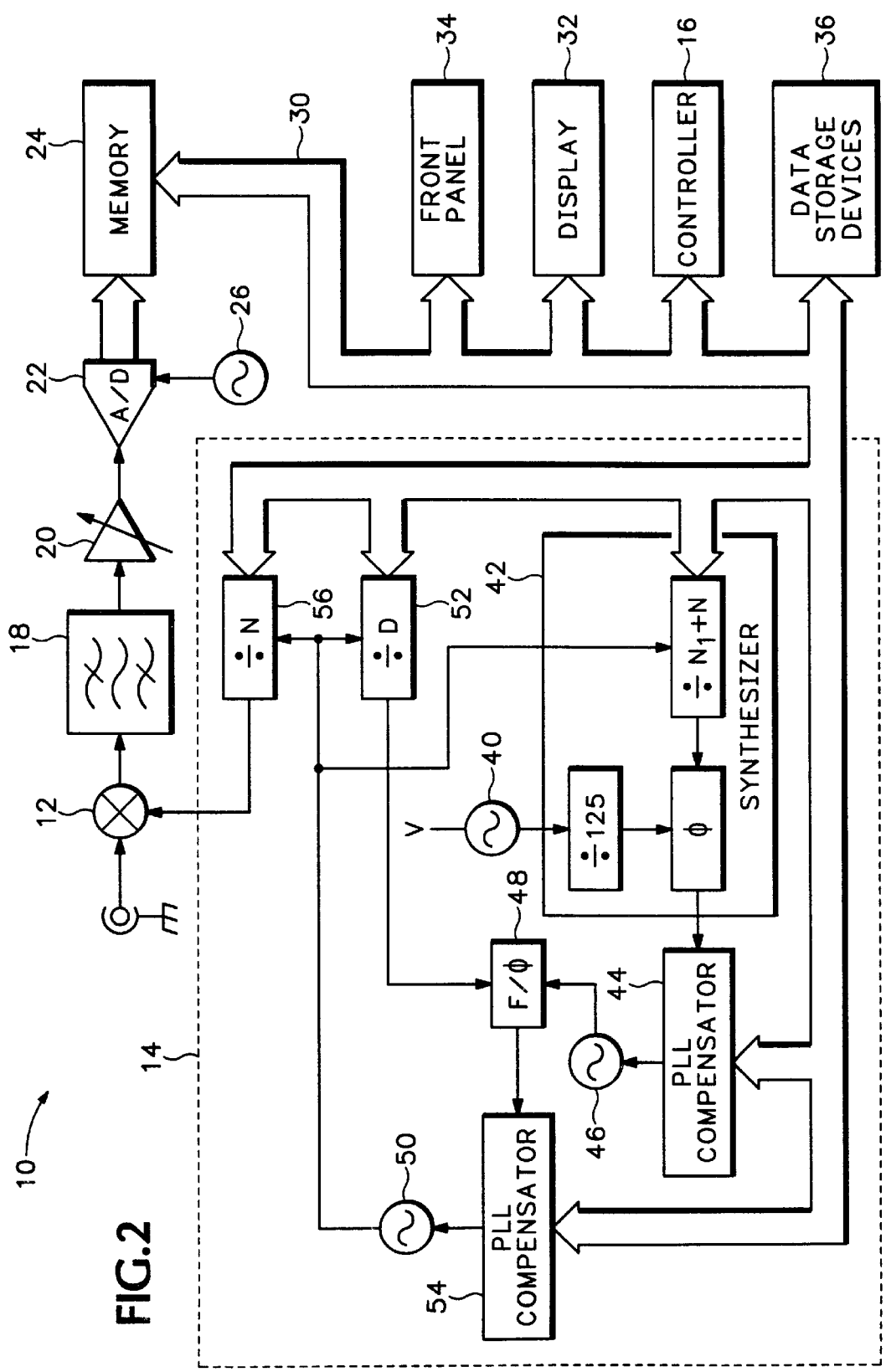
FIG. 2 is representative block diagram of a frequency spectrum measurement apparatus according to the present invention.

Referring to FIG. 2, there is shown a representative block diagram of the frequency spectrum measurement apparatus 10 according to the present invention. An input signal is applied to a mixer 12 that receives a variable frequency signal from a microprocessor controlled frequency synthesizer 14 functioning as a local oscillator. The frequency synthesizer 14 is tunable over a range of frequencies in response to input values from a controller 16 that will be described in greater detail below. The output of the mixer 12 is an intermediate frequency signal that is coupled to a bandpass filter 18. The bandpass filter 18 is very narrow with respect to the IF bandwidth used by the receiver. The bandpass filtered IF signal is amplified in a number of gain stages as represented by the variable amplifier 20. The output of the variable amplifier 20 is coupled to the input of A/D converter 22 for generating signal samples of the filtered IF signal. The signal samples are stored in a memory 24 for further processing. A sampling clock generator 26 is coupled to the clock input of the A/D converter 22 for sampling the IF signal at the input of the AID converter 22.

Memory 24 includes both RAM, ROM and cache memory with the RAM memory storing volatile data, such as the signal samples representative of the IF signal and the like, the ROM storing non-volatile data, such as program control instructions used by the apparatus 10 and constant data values, and cache memory storing data for immediate microprocessor access. A data and control bus 30 couples memory 24 to the controller 16, such as a PENTIUM® microprocessor, manufactured and sold by Intel, Corp., Santa Clara, Calif. The data and control bus 30 is also coupled to a display device 32, such as a liquid crystal display, cathode ray tube or the like, and a front panel 34 having input devices, such as buttons, knobs, switches or the like directly mounted on the front panel or an attached mouse or keyboard. The display device 32 may be implemented with touch screen capability providing a further input device means as is implemented in the present invention. Data storage devices 36, such as a hard disk drive, floppy disk drive and/or CD ROM drive(s) are also coupled to the control bus 30. The bus 30 couples the controller 16 to the frequency synthesizer 14.

The frequency synthesizer 14 may be implemented in a number of differing circuit designs with the below described implementation being one of many. The criteria for any of the designs includes tuning through a range of frequencies compatible with the range of input signal being analyzed. Further, the synthesizer needs to track changes in the variable frequency output signal for maintaining the frequency synthesizer in a locked condition and the synthesizer needs to exhibit low phase noise so that excessive phase variations are not added to the signal under test.

The frequency synthesizer 14 includes a reference oscillator 40 that receives a DC reference signal for producing an output signal in the range of about 10 MHz. The reference oscillator 40 output is coupled to a synthesizer 42, such as a SA8052A Fractional-N Synthesizer IC, manufactured and sold by Philips, Inc. The synthesizer 42 receives input values from the controller 16 for generating a variable frequency output signal from frequency synthesizer 14. The output of the synthesizer 42 is coupled through a PLL compensation circuit 44 to a variable frequency oscillator 46 operating in the range of 20 to 22 MHz. The PLL compensation circuit 44 includes analog circuitry, such as operational amplifiers, and a buffered multiplying digital-to-analog converter (DAC), such as manufactured and sold by Analog Devices under Part No. AD7528, for filtering, DC level shifting, gain compensation, and the like of the synthesizer 42 output. The controller 16 provides values to the DAC for varying the gain of the compensation circuit to control the loop bandwidth and loop dynamics. The variable frequency oscillator 46 produces a variable frequency output in response to the tuning voltage signal from the PLL compensation circuit 44. The output of the variable frequency oscillator 46 is coupled to a phase/frequency detector 48. The phase/frequency detector 48 also receives a divided down local oscillator signal from the local oscillator 50 via a variable divider 52. The local oscillator 50 can be implemented using dual oscillators with one operating in a lower frequency band and the other operating in a higher frequency band combined with frequency dividers, represented by variable divider 56, having factors 1, 2, 4 ... $2^k$. The value D in the variable divider 52 is set by the controller 16 via bus 30 for dividing the local oscillator signal to the range of the variable reference oscillator signal. The frequency/phase detector 48 produces an error signal that is proportional to the phase difference between the divided down local oscillator signal and the variable frequency oscillator signal. The error signal is processed by a PLL compensation circuit 54 for producing a tuning voltage signal to the local oscillator 50 that changes the local oscillator signal to a different frequency. The PLL compensation circuit 54 is of similar design to the PLL compensation circuit 44 and also receives values from the controller 16 for varying the gain of the compensation circuit 54 to control loop bandwidth and loop dynamics.

The controller 16 in the frequency spectrum measurement apparatus of the present invention generates a non-contiguous sequence of input values to the synthesizer 14 that results in a non-contiguous frequency output signal over a frequency range from the synthesizer with each value offsetting a current frequency output signal from a previous frequency output signal. A particular implementation of the above described frequency spectrum measurement apparatus 10 with non-contiguous frequency output signal produces a multiple scan line frequency sweep. The frequency ranges, frequency offset, the number of scan lines, frequency step size and the values generated by the controller 16 and applied to the frequency synthesizer 14 are used by example and other frequency ranges, frequency offsets, scan lines, frequency step sizes and input values may be used without departing from the scope of the invention as set forth in the appended claims.

In operation, the controller 16 generates a non-contiguous sequence of input values to the synthesizer 42. Internally, the synthesizer 42 divides the 10 MHz reference signal down to an 80 KHz signal and passes the signal to a phase detector. The input values to the synthesizer 42 from controller 16 are applied to a divide-by-N in the synthesizer 42 as a divide-by ratio. The Fractional-N synthesizer used in implementing the present invention implements the divide-by- N in the form $(N_1+A/8)$ where $N_1$ can range from 5000 to 10,000 and A can range from 0 to 7. The controller 16 implements a number generator which may be a stored look-up table containing the appropriate $N_1$ and A values for each particular frequency. In the preferred embodiment of the invention, the $N_1$ and A values are generated using an algorithm derived from the data sheet for the particular Fractional-N synthesizer used in the implemented invention. The controller 16 applies the $N_1$ and A values to the synthesizer 42 to produce an output from the synthesizer 42 for driving the variable frequency oscillator 46 for setting the frequency of the local oscillator 50. The synthesizer 42 divide-by-$(N_1+A/8)$ receives the output of the local oscillator 50 and divides the local oscillator 50 signal by the input values and applies the divided down signal to the phase detector. For example, the local oscillator 50 signal is 400 MHz produced by the controller 16 applying an $N_1$ value of 5000 and an A value of 0 to the divide-by-$(N_1+A/8)$. The output of the divide by divide-by-$(N_1+A/8)$ is 80 KHz which is equal to the divided down 10 MHz reference. The synthesizer 42 output is coupled to the PLL compensation circuit 44 that provides a tuning voltage for driving the variable frequency oscillator 46. The output of the variable frequency oscillator 46 is coupled to the phase/frequency detector 48 that receives the divided down output of the local oscillator 50 from the variable divider 52. The phase/frequency detector 48 output is coupled to the PLL compensation circuit 54 that provides tuning voltage for driving the local oscillator 50.

Should, for example, the controller 16 apply a new set of values (e.g. N=5000 and A=1), the divide by ratio for the divide-by-$(N_1+A/8)$ becomes 5000.125. The 400 MHz local oscillator 50 signal is divided by the new divide-by ratio in the synthesizer 42 producing an output of 79.998 KHz that is applied to the phase detector in the synthesizer 42. The phase detector produces an output signal proportional to the difference between the 80 KHz reference signal and the divided down local oscillator signal. The phase error signal is passed through the PLL compensation circuit 44 and drives the variable frequency oscillator 46 to a higher frequency output level. The higher frequency output signal from the variable frequency oscillator 46 is coupled to the phase/frequency detector 48 that is receiving the divided down 400 MHz output from the local oscillator 50. The phase/frequency detector 48 produces an output signal proportional to the difference between the higher frequency output signal from the variable frequency oscillator 46 and the divided down local oscillator 50 signal. The phase error signal from the phase/frequency detector 48 is passed through the PLL compensation circuit 54 that drives the local oscillator output to 400.010 MHz (5000.125×80 KHz) to bring the frequency synthesizer 14 to a new phase locked frequency.

The non-contiguous sweeping frequency spectrum measurement apparatus of the present invention is used for measuring out of channel emissions in an 8-VSB digital television transmission system. Out of channel emissions are measured in an 18 MHz span and a 30 MHz span respectively covering three and five digital television channels. The output of the local oscillator 50 covers a range of about 400 MHz to approximately 836 MHz. The variable divider 56 divides the local oscillator 50 output into additional ranges of 200 MHz to approximately 400 MHz and 100 MHz to approximately 200 MHz.

The frequency spectrum measurement apparatus sweeps the desired frequency range through multiple scan lines as mathematically expressed by the point indexes:

Line 1: $f_1 \quad f_{(m+1)} \quad \cdots \quad f_{(n*m+1)}$

Line 2: $f_2 \quad f_{(m+2)} \quad \cdots \quad f_{(n*m+2)}$ $\vdots \qquad\qquad\qquad\qquad \vdots$ Line $m$: $f_m \quad f_{(m+m)} \quad \cdots \quad f_{(n*m+m)}$ The frequency range is divided into m scan lines and the time it takes to complete an individual scan line is about 1/m of the total time to perform a complete frequency scan over the frequency range. Each scan line starts with a different offset frequency from the start frequency and the frequency step size is m times the frequency step size of the conventional sweep. The next set of scan lines covers a different set of frequency points. After m scans, all frequency points are covered as in the conventional sweep. In the preferred embodiment of the invention, after each frequency scan line, frequency points in the spectrum are updated and reported. After the first m scans, a complete frequency spectrum of the input signal with (n*m+m) frequency points will be reported. In the preferred embodiment of the invention, the frequency step size is 100 KHz, each scan line is offset from the previous scan line by 20 KHz, and there are 5 scan lines covering the frequency range.

Figure 3:
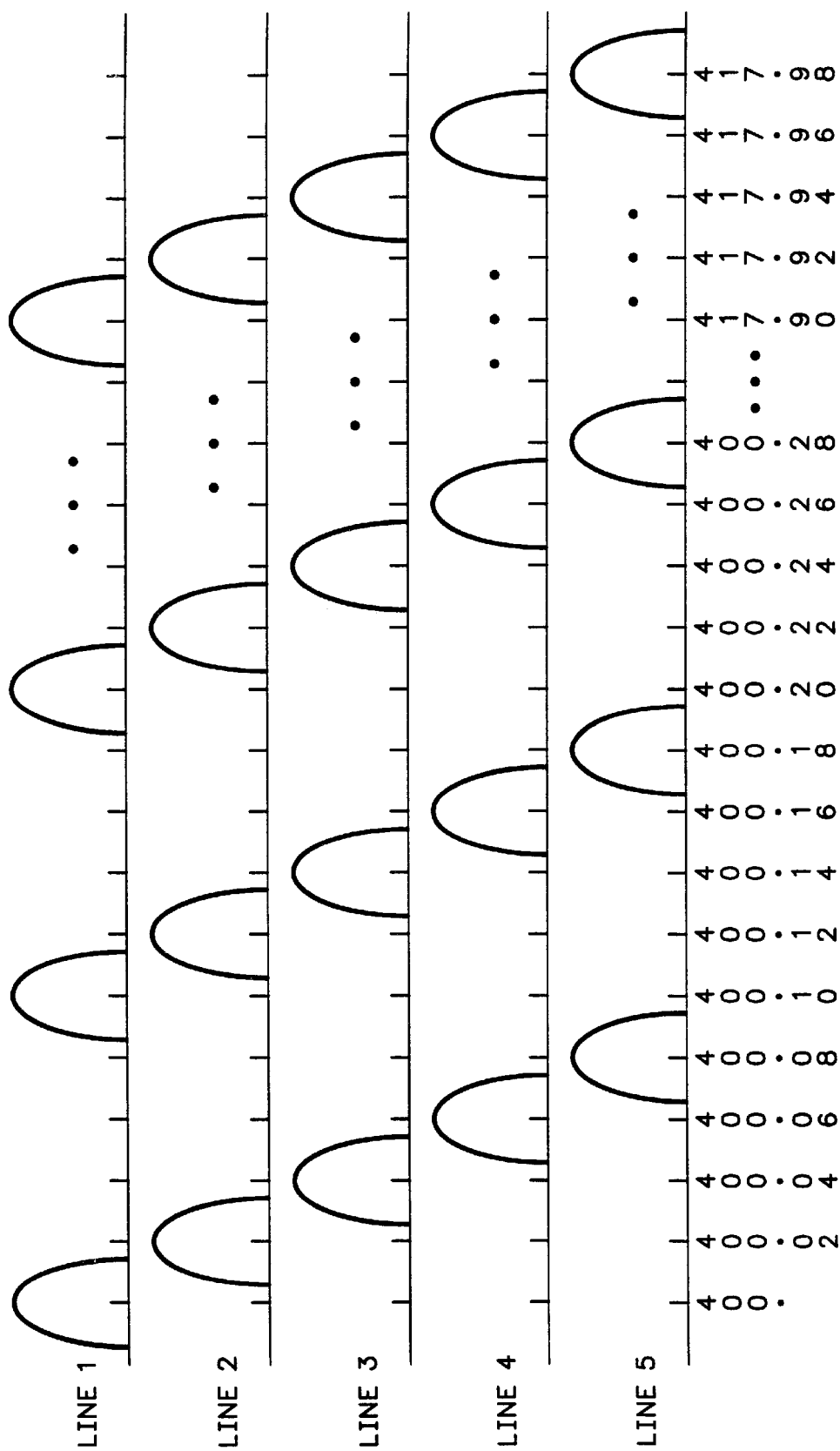
FIG. 3 is a visual representation of the interlaced frequency scan in the frequency measurement apparatus according to the present invention.

FIG. 3 and the Table 1 illustrate the multiple scan line non-contiguous sweeping frequency spectrum measurement apparatus of the present invention. In the example, the frequency range is from 400 MHz to 417.98 MHz with frequency step size within each scan of 100 KHz and an frequency offset of 20 KHz between the scan lines. In the preferred embodiment of the invention, the bandpass filter 18 is a 30 KHz filter.

TABLE 1

| | Controller Input Values and L. O. Frequency (MHz) | | Controller Input Values and L. O. Frequency (MHz) | | Controller Input Values and L. O. Frequency (MHz) | | Controller Input Values and L. O. Frequency (MHz) | |
|---|---|---|---|---|---|---|---|---|
| | $N_1$ | A | $N_1$ | A | $N_1$ | A | ... $N_1$ | A |
| Line 1 | 5000 | 0 | 5001 | 2 | 5002 | 4 | ... 5223 | 6 |
| | 400.00 | | 400.10 | | 400.20 | | 417.90 | |
| Line 2 | 5000 | 2 | 5001 | 4 | 5002 | 6 | ... 5224 | 0 |
| | 400.02 | | 400.12 | | 400.22 | | 417.92 | |
| Line 3 | 5000 | 4 | 5001 | 6 | 5003 | 0 | ... 5224 | 2 |

TABLE 1-continued

| | Controller Input Values and L. O. Frequency (MHz) | | Controller Input Values and L. O. Frequency (MHz) | | Controller Input Values and L. O. Frequency (MHz) | | Controller Input Values and L. O. Frequency (MHz) | |
|---|---|---|---|---|---|---|---|---|
| | $N_1$ | A | $N_1$ | A | $N_1$ | A | ... $N_1$ | A |
| | 400.04 | | 400.14 | | 400.24 | | 417.94 | |
| Line 4 | 5000 | 6 | 5002 | 0 | 5003 | 2 | ... 5224 | 4 |
| | 400.06 | | 400.16 | | 400.26 | | 417.96 | |
| Line 5 | 5001 | 0 | 5002 | 2 | 5003 | 4 | ... 5224 | 6 |
| | 400.08 | | 400.18 | | 400.28 | | 417.98 | |

The local oscillator 50 produces a stepped non-contiguous frequency output in response to the controller input values. The non-contiguous frequency output is coupled to mixer 12 for down converting the input signal to be measured to an IF frequency signal. The IF frequency signal is filtered by the 30 KHz bandpass filter 18 and amplified by the amplifier stage 20. The amplifier 20 output is input to the A/D converter 22 that is driven, in the preferred embodiment, by an approximately 43.04 MHz sampling clock. The A/D converter 22 converts the filtered signal spectrum for each frequency step change of the local oscillator 50 to signal samples. The signal samples are stored in memory 24. In the preferred embodiment, the signal samples are processed by the controller 16 under program control at the end of each frequency step to determine the average power level of the filtered signal for each frequency step change of the local oscillator 50. The calculated average power levels for each frequency point are then output to display 32. Alternately, the average power level for each frequency step may be calculated and displayed at the end of each scan line.

As previously described, the local oscillator 50 output is divided down by variable divider 56 for the 200 MHz to 400 MHz and 100 MHz to 200 MHz ranges. In the 200 MHz to 400 MHz range, the frequency step size and the offset frequencies are doubled from the 400 MHz to 800 MHz range. For example, the controller input values for the second frequency point of line one would be $N_1$=5002 and A=4 which would produce an local oscillator 50 frequency of 400.20 MHz. Dividing the 400.20 MHz frequency by 2 in the variable divider 56 produces an output of 200.10 MHz, which is the desired 100 KHz step size. Likewise, the controller 16 input values for the first frequency point in line 2 are $N_1$=5000 and A=4 to produce a local oscillator output of 400.04 MHz, which is divided by 2 in the variable divider 56 to produce the desired offset frequency of 200.02 MHz. For the 100 MHz to 200 MHz range, the frequency step size and the offset frequencies from the local oscillator 50 is four times that of the 400 MHz to 800 MHz range.

A frequency spectrum measurement apparatus 10 has been described that sweeps a desired frequency range using multiple scan lines. A controller 16 provides a non-contiguous sequence of input values to a frequency synthesizer 14 operating as a local oscillator for generating a non-contiguous frequency output signal over the desired frequency range with each value offsetting a current frequency output signal from a previous frequency output signal. A mixer 12 receives an input signal and the variable frequency synthesizer signal for generating an intermediate frequency signal that is filtered through a bandpass filter 18. The power of the intermediate frequency signal output of the bandpass filter 18 is amplified and digitized to produce signal samples representative of the bandpassed signal. The signal samples are processed by the controller 16 to generate an average power measurement of the filtered IF signal spectrum. The average spectral power is displayed on display 32 to provide an out of channel emissions measurement for a terrestrial digital television transmission system.

It will be obvious to those having skill in the art that many changes may be made to the details of the above-described embodiments of this invention without departing from the underlying principles thereof. Accordingly, the scope of the present invention should, therefore, be determined only by the following claims.

What is claimed is:

1. A frequency spectrum measurement apparatus comprising:
    a synthesizer generating a variable frequency output signal over a frequency range;
    a mixer receiving an input signal and the variable frequency output signal for generating an intermediate frequency signal; and
    a controller generating a non-contiguous sequence of input values to the synthesizer for generating in response to the input values a non-contiguous frequency output signal as the variable frequency output signal with each input value offsetting a current frequency output signal from a previous frequency output signal.

2. The frequency spectrum measurement apparatus as recited in claim 1 wherein the controller comprises a number generator for producing the non-contiguous sequence of input values to the synthesizer for generating the non-contiguous frequency output signal from the synthesizer having multiple frequency scan lines.

3. The frequency spectrum measurement apparatus as recited in claim 2 wherein the number generator produces at least a first and a second series of non-contiguous input values to the synthesizer for generating at least first and second frequency scan lines as the multiple frequency scan lines with the first series of non-contiguous input values producing the first frequency scan line having a start frequency and a series of stepped frequency values corresponding to the first series of non-contiguous input values and the second series of non-contiguous input values producing the second frequency scan line having a start frequency offset from the start frequency of the first scan line and a series of stepped frequency values offset from the stepped frequency values of the first scan line and corresponding to the second series of non-contiguous input values.

4. The frequency spectrum measurement apparatus as recited in claim 1 further comprising a bandpass filter receiving the intermediate frequency signal for generating a filtered intermediate frequency signal.

5. The frequency spectrum measurement apparatus as recited in claim 4 further comprising means for measuring average power values of the filtered intermediate frequency signal over the frequency range.

6. The frequency spectrum measurement apparatus as recited in claim 5 wherein the measuring means comprises an analog-to-digital converter receiving the filtered intermediate frequency signal for generating signal samples with the controller processing the signal samples for generating the average power values of the filtered intermediate frequency signal.

7. The frequency spectrum measurement apparatus as recited in claim 5 further comprising a display device for displaying the average power values.

* * * * *